US008711572B2

(12) United States Patent
Hsu

(10) Patent No.: US 8,711,572 B2
(45) Date of Patent: Apr. 29, 2014

(54) CIRCUIT BOARD HAVING SEMICONDUCTOR CHIP EMBEDDED THEREIN

(75) Inventor: Shih-Ping Hsu, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 84 days.

(21) Appl. No.: 13/551,151

(22) Filed: Jul. 17, 2012

(65) Prior Publication Data
US 2012/0281375 A1 Nov. 8, 2012

Related U.S. Application Data

(63) Continuation of application No. 12/496,136, filed on Jul. 1, 2009.

(51) Int. Cl.
*H05K 1/18* (2006.01)

(52) U.S. Cl.
USPC ........... 361/761; 361/766; 361/763; 361/764; 361/783; 174/258; 174/260

(58) Field of Classification Search
USPC ........................ 361/763, 766, 761, 764, 783
See application file for complete search history.

(56) References Cited

U.S. PATENT DOCUMENTS

| | | | |
|---|---|---|---|
| 6,370,013 B1 | 4/2002 | Iino et al. | |
| 2004/0160751 A1 | 8/2004 | Inagaki et al. | |
| 2006/0278958 A1 | 12/2006 | Pueschner et al. | |
| 2006/0290010 A1 | 12/2006 | Hsu | |
| 2007/0013079 A1 | 1/2007 | Hsu | |
| 2007/0143993 A1 | 6/2007 | Hsu | |
| 2008/0277150 A1* | 11/2008 | Takashima et al. | 174/260 |
| 2010/0025082 A1* | 2/2010 | Sasaoka et al. | 174/252 |

* cited by examiner

*Primary Examiner* — Tuan T Dinh
*Assistant Examiner* — Steven T Sawyer
(74) *Attorney, Agent, or Firm* — Edwards Wildman Palmer LLP; Peter F. Corless; Steven M. Jensen

(57) ABSTRACT

A circuit board having a semiconductor chip embedded therein includes: a core board having opposing first and second surfaces and a through-hole; a semiconductor chip received in the through-hole and having a first active surface and an opposing second active surface, wherein first electrode pads comprising signal pads, power pads, and ground pads are provided on the first active surface; a first dielectric layer provided on the first surface of the core board and the first active surface of the semiconductor chip and configured to fill a gap between the through-hole and the semiconductor chip so as to secure the semiconductor chip in position to the through-hole; and a first circuit layer disposed in the first dielectric layer so as to be flush with the first dielectric layer, provided with first conductive vias disposed in the first dielectric layer, and electrically connected to the first electrode pads.

13 Claims, 7 Drawing Sheets

CIRCUIT BOARD HAVING SEMICONDUCTOR CHIP EMBEDDED THEREIN

CROSS-REFERENCE TO RELATED APPLICATIONS

This application is a continuation of copending application U.S. Ser. No. 12/496,136, filed on Jul. 1, 2009, which claims under 35 U.S.C. §119(a) the benefit of Taiwanese Application No. 097125163, filed Jul. 4, 2008, the entire contents of which are incorporated herein by reference.

BACKGROUND OF THE INVENTION

1. Field of the Invention

The present invention relates to semiconductor devices, and more particularly, to a circuit board having a semiconductor chip embedded therein.

2. Description of the Prior Art

With electronic products becoming smaller, thinner, and more compact, a typical package substrate for carrying a semiconductor chip or electronic components has to be downsized. Semiconductor manufacturers developed various packages, and one of which is ball grid array (BGA). An advanced semiconductor package technology, BGA enables more I/O connections to be provided in a unit area of a package substrate so as to meet requirements for integration of a semiconductor chip.

However, with a conventional BGA semiconductor package, a semiconductor chip is adhered to a package substrate and then undergoes wire bonding, or a semiconductor chip is flip-chip-connected to a package substrate before solder balls are implanted on the back of the package substrate for electrical connection. In so doing, BGA achieves a high pin number and yet causes drawbacks: during high-frequency or high-speed operation, wires with long conduction paths prevent enhancement of electric characteristics and thereby restrict performance; and performing the step of interface connecting repeatedly incurs high manufacturing costs.

To efficiently enhance electric quality and meet the demand for products of the next generation, manufacturers endeavor to study how to embed a semiconductor chip in a package substrate to enable direct electrical connection so as to shorten a path of electrical conduction, reduce signal loss and signal distortion, and enhance performance during high-speed operation.

Referring to FIG. 1A through FIG. 1G, schematic views of a conventional circuit board having a semiconductor chip embedded therein during a fabrication process thereof are shown.

Referring to FIG. 1A, a substrate body 10 is provided. The substrate body 10 has a first surface 10a, an opposing second surface 10b, and a through-hole 100 disposed in the substrate body 10 to penetrate the first surface 10a and the second surface 10b. A first core circuit layer 101 and a second core circuit layer 102 are disposed on the first surface 10a and the second surface 10b, respectively. A plurality of conductive vias 103 are disposed in the substrate body 10 to penetrate the first surface 10a and the second surface 10b and thereby electrically connect the first core circuit layer 101 and the second core circuit layer 102. A semiconductor chip 11 is received in the through-hole 100. The semiconductor chip 11 has an active surface 11a and an opposing inactive surface 11b. A plurality of electrode pads 111 are provided on the active surface 11a Referring to FIG. 1B, a first dielectric layer 12a made of resin clad copper foil (RCC) and provided with a first metal layer 13a thereon is laminated to the active surface 11a of the semiconductor chip 11 and the first surface 10a of the substrate body 10, and a second dielectric layer 12b made of resin clad copper foil (RCC) and provided with a second metal layer 13b thereon is laminated to the inactive surface 11b of the semiconductor chip 11 and the second surface 10b of the substrate body 10. The first dielectric layer 12a and the second dielectric layer 12b fill the through-hole 100 so as for the semiconductor chip 11 to be fixed in position to the through-hole 100.

Referring to FIG. 1C, a plurality of first apertures 120a corresponding in position to the electrode pads 111 on the semiconductor chip 11 are disposed in the first dielectric layer 12a and the first metal layer 13a by laser drilling so as for a portion of the surface of the electrode pads 111 to be exposed. Likewise, a plurality of second apertures 120b corresponding in position to a portion of the second core circuit layer 102 are disposed in the second dielectric layer 12b and the second metal layer 13b by laser drilling so as for a portion of the second core circuit layer 102 to be exposed to thereby form electrically connected to pads 102a.

Referring to FIG. 1D, a first conductive layer 14a is disposed on the first metal layer 13a, the inner wall of the first apertures 120a, and a portion of the electrode pads 111. Likewise, a second conductive layer 14b is disposed on the second metal layer 13b, the inner wall of the second apertures 120b, and a portion of electrically connected to pads 102a.

Referring to FIG. 1E, disposed on the first conductive layer 14a is a first resist layer 15a provided with a plurality of first opening areas 150a for exposing a portion of the first conductive layer 14a. Likewise, disposed on the second conductive layer 14b is a second resist layer 15b provided with a plurality of second opening areas 150b for exposing a portion of the second conductive layer 14b.

Referring to FIG. 1F, a first circuit layer 16a and a second circuit layer 16b are disposed on the exposed portions of the first conductive layer 14a and the second conductive layer 14b exposed from the first opening areas 150a and the second opening areas 150b, respectively, and disposed in the first apertures 120a are a plurality of first conductive vias 161a for electrically connecting with the electrode pads 111 on the semiconductor chip 11. Likewise, disposed in the second apertures 120b are a plurality of second conductive vias 161b for electrically connecting with pads 102a.

Referring to FIG. 1G, the first conductive layer 14a and the first metal layer 13a beneath the first resist layer 15a are removed to expose the first circuit layer 16a and the first dielectric layer 12a. Likewise, the second resist layer 15b and the second conductive layer 14b and the second metal layer 13b beneath the second resist layer 15b are removed to expose the second circuit layer 16b and the second dielectric layer 12b.

Embedding the semiconductor chip 11 in the through-hole 100 solves problems arising from a long path of electrical conduction of a wire of the prior art, but the first metal layer 13a completely covers the first dielectric layer 12a and thereby covers an alignment target of the semiconductor chip 11, and in consequence during a process of forming the first apertures 120a in the first metal layer 13a and the first dielectric layer 12a by laser drilling, the first metal layer 13a affects the standard alignment of laser drilling and therefore compromises the preciseness in positioning the aperture; as a result, it is difficult to accurately align the first apertures 120a with the electrode pads 111 on the semiconductor chip 11, respectively. This has an unfavorable effect on electrical connection of the electrode pads 111 and the first conductive vias 161a subsequently provided in the first apertures 120a, and thus reliability of electrical connection is compromised.

The first circuit layer 16a is disposed on the first dielectric layer 12a. On the first metal layer 13a, a metal layer is provided by plating the first circuit layer 16a to the first conductive layer 14a and then by removing the first resist layer 15a and the first conductive layer 14a and the first metal layer 13a beneath the first resist layer 15a by chemical etching. However, removing the first conductive layer 14a and the first metal layer 13a otherwise covered by the first resist layer 15a causes the line-width side of the first circuit layer 16a to be removed by etching. Hence, it is necessary to allow for a relatively large line width of the first circuit layer 16a so as to avoid etching. In so doing, reduction of the line width and pitch of the first circuit layer 16a is infeasible to the detriment of a high-density layout.

In addition, owing to advancement of technology, to meet the demand for multiplexing and high-frequency functionality, the electrode pads 111 on the semiconductor chip 11 are becoming closer to each other, wherein the electrode pads 111 comprise power pads and signal pads. If the signal pads are too close to each other, noise will be generated as a result of interference from between the semiconductor chips 11 in high-frequency operation, thus resulting in signal distortion and deterioration of electric performance.

Accordingly, manufacturers are confronted with an urgent issue that involves providing a semiconductor package having a semiconductor chip embedded therein with a view to overcoming drawbacks of the prior art, namely: a circuit is made from a metal layer that affects an alignment target, and thus conductive vias in the circuit layer are unlikely to be electrically connected to the electrode pads on the semiconductor chip accurately; the conventional circuit layer does not feature fine pitches and therefore is unfavorable for a high-density layout; and during high-frequency operation of the semiconductor chip, closely-provided signal pads bring about interference-induced noise, thus resulting in signal distortion and deterioration of electric performance.

SUMMARY OF THE INVENTION

In view of the drawbacks of the prior art, it is an objective of the present invention to provide a circuit board having a semiconductor chip embedded therein, so as to overcome a drawback of the prior art, namely a circuit is made from a metal layer that affects an alignment target, and thus conductive vias in the circuit layer are unlikely to be electrically connected to the electrode pads on the semiconductor chip accurately.

Another objective of the present invention is to provide a circuit board having a semiconductor chip embedded therein, so as to provide fine pitches that facilitate a high-density layout and thereby enhance electric performance.

Yet another objective of the present invention is to provide a circuit board having a semiconductor chip embedded therein, so as to overcome a drawback of the prior art, namely, during high-frequency operation of the semiconductor chip, closely-provided signal pads bring about interference-induced noise, thus resulting in signal distortion and deterioration of electric performance.

To achieve the above and other objectives, the present invention provides a circuit board having a semiconductor chip embedded therein. The circuit board comprises: a core board having opposing first and second surfaces and a through-hole penetrating the first and second surfaces; a semiconductor chip received in the through-hole and having a first active surface and an opposing second active surface, wherein a plurality of first electrode pads comprising signal pads, power pads, and ground pads are provided on the first active surface; a first dielectric layer disposed on the first surface of the core board and the first active surface of the semiconductor chip and configured to fill a gap between the through-hole and the semiconductor chip so as for the semiconductor chip to be fixed in position to the through-hole; and a first circuit layer disposed in the first dielectric layer so as to be flush with the first dielectric layer, provided with a plurality of first conductive vias disposed in the first dielectric layer, and electrically connected to the first electrode pads provided on the semiconductor chip, wherein the first circuit layer has a plurality of series-connection portions.

Regarding a circuit board having a semiconductor chip embedded therein as disclosed in the present invention, the core board is an insulated board, and the second active surface of the semiconductor chip is an inactive surface.

A passivation layer is disposed on the first active surface of the semiconductor chip. The first electrode pads are disposed on the passivation layer and electrically connected to the semiconductor chip. An alignment target is disposed in a clean area of the semiconductor chip, or one of the first electrode pads is the alignment target.

A plurality of first vias and first trenches are disposed in the first dielectric layer. Portions of the first trenches are in communication with the first vias. The first circuit layer is disposed in the first trenches. The first conductive vias are disposed in the first vias. The series-connection portions of the first circuit layer are electrically connected to at least two said power pads; alternatively, the series-connection portions are electrically connected to at least two said ground pads.

The circuit board having a semiconductor chip embedded therein further comprises a first build-up structure disposed on the first dielectric layer and the first circuit layer, the first build-up structure comprising a second dielectric layer having second vias and second trenches, a second circuit layer disposed in the second trenches of the second dielectric layer and flush with the second dielectric layer, and a plurality of second conductive vias disposed in the second vias of the second dielectric layer, allowing the second conductive vias to be electrically connected to the first and second circuit layers, the second circuit layer on top of the first build-up structure to be provided with the first electrical contact pads, the first build-up structure to be covered with a first solder mask layer, and a portion of a surface of the first electrical contact pads to be exposed from a plurality of first solder mask layer openings in the first solder mask layer.

In another embodiment further provided by the present invention, the core board is configured to be a circuit board having circuits thereon, provided with a core circuit layer on the first surface and the second surface of the core board, and provided with a plating through hole or fourth conductive vias penetrating the core board for electrically connecting the core circuit layer on the first and second surfaces of the core board. The second active surface of the semiconductor chip is an inactive surface. A second solder mask layer is provided on the second surface of the core board. A plurality of solder mask layer openings are provided in the second solder mask layer to expose the inactive surface of the semiconductor chip.

The present invention provides a further embodiment. The core board is configured to be a circuit board having circuits thereon, provided with a core circuit layer on the first surface and the second surface of the core board, and provided with a conductive via or fourth conductive vias penetrating the core board for electrically connecting the core circuit layer on the first and second surfaces of the core board. The second active surface of the semiconductor chip is an inactive surface. A second build-up structure is provided on the second surface of the core board. The second build-up structure comprises: a third dielectric layer having third vias and third trenches, a third circuit layer disposed in the third trenches of the third dielectric layer and flush with the third dielectric layer, and a plurality of third conductive vias disposed in the third vias of the third dielectric layer and electrically connected to the third circuit layer, wherein a plurality of second electrical contact pads are provided on the third circuit layer on top of the second build-up structure, and the second build-up structure is covered with a second solder mask layer having a plurality of second solder mask layer openings provided therein for exposing a portion of a surface of the second electrical contact pads.

The first dielectric layer and third dielectric layer fill a gap between the through-hole of the core board and the semiconductor chip so as for the semiconductor chip to be fixed in position to the through-hole.

The present invention provides a further embodiment. A plurality of second electrode pads are provided on the second active surface of the semiconductor chip. A second build-up structure provided on the second surface of the core board and the second active surface of the semiconductor chip. The second build-up structure comprises: at least a third dielectric layer having third vias and third trenches, a third circuit layer provided in the third trenches of the third dielectric layer and flush the third dielectric layer, and a plurality of third conductive vias provided in the third vias of the third dielectric layer and electrically connected to the third circuit layer and second electrode pads, allowing the third circuit layer on top of the second build-up structure to be provided with a plurality of second electrical contact pads, the second build-up structure to be covered with a second solder mask layer, and a portion of a surface of the second electrical contact pads to be exposed from a plurality of second solder mask layer openings in the second solder mask layer.

The first dielectric layer and third dielectric layer fill a gap between the through-hole of the core board and the semiconductor chip so as for the semiconductor chip to be fixed in position to the through-hole.

BRIEF DESCRIPTION OF THE DRAWINGS

FIG. 2A' is a top elevational view of FIG. 2A;

FIG. 2F' is a top elevational view of FIG. 2F; and

DETAILED DESCRIPTION OF THE EMBODIMENTS

To enable persons skilled in the art to gain insight into technical features and effects of the present invention, the present invention is hereunder illustrated with preferred embodiments in conjunction with the accompanying drawings, wherein:

Referring to FIG. 2A through FIG. 2G, cross-sectional views of a circuit board having a semiconductor chip embedded therein according to the present invention are shown.

Figure 1A:
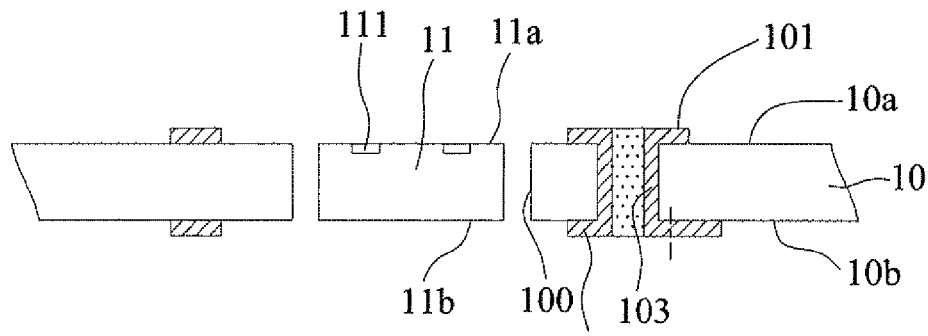
FIG. 1A through FIG. 1G are schematic views of a conventional circuit board having a semiconductor chip embedded therein described by reference to a fabrication process of the conventional circuit board.
Figure 1B:
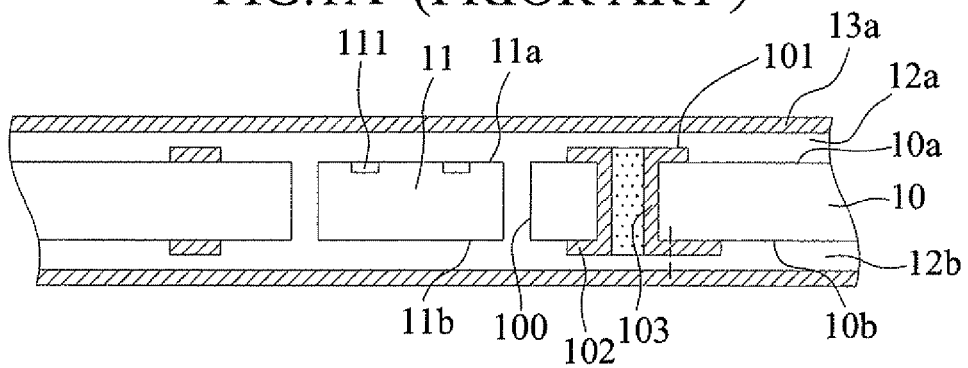
Figure 1C:
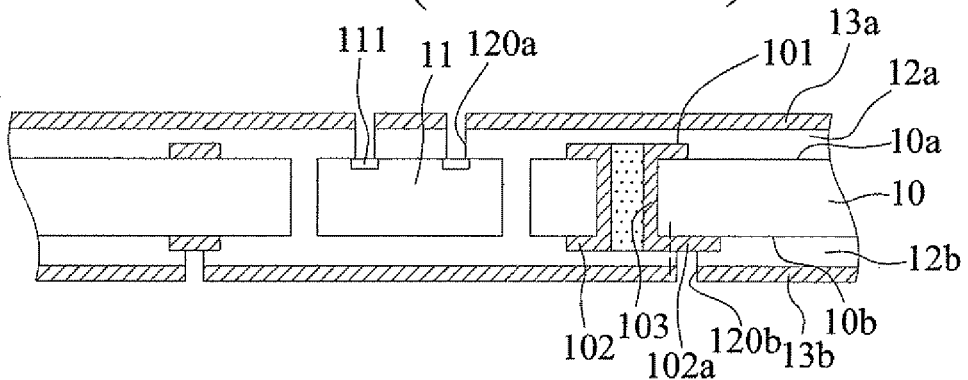
Figure 1D:
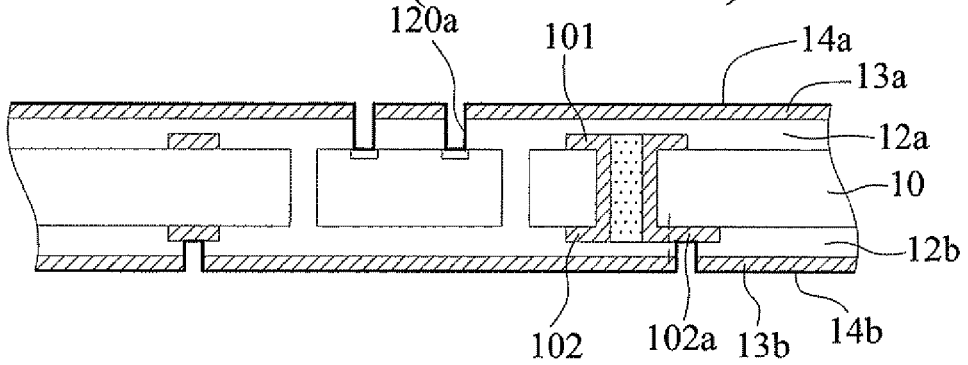
Figure 1E:
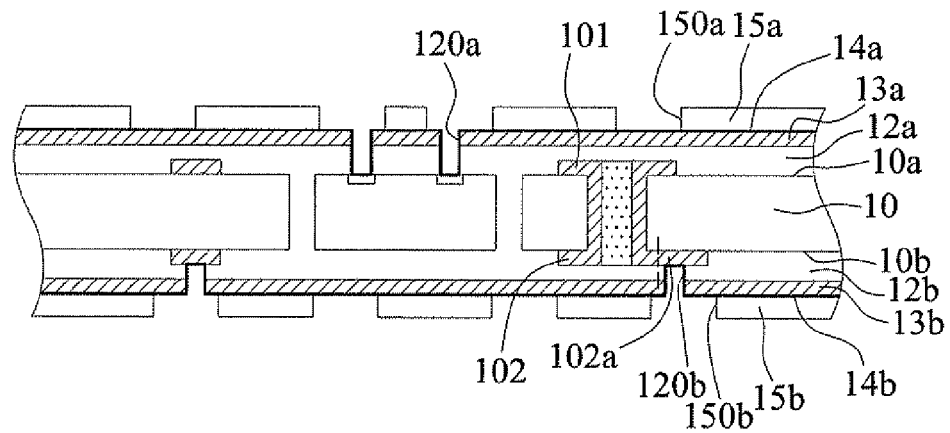
Figure 1F:
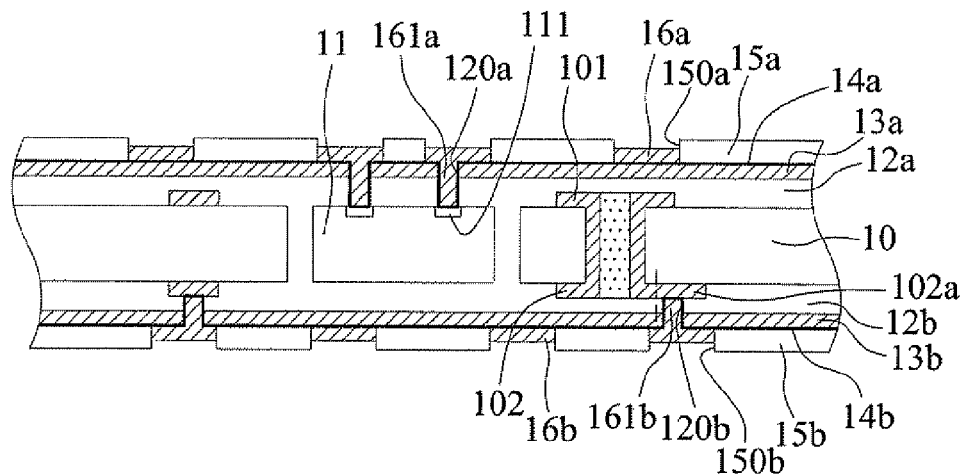
Figure 1G:
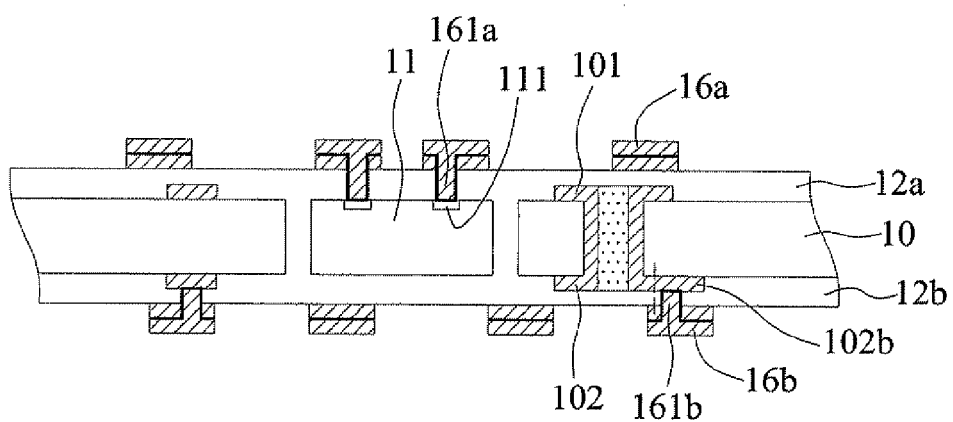
Figure 2A:
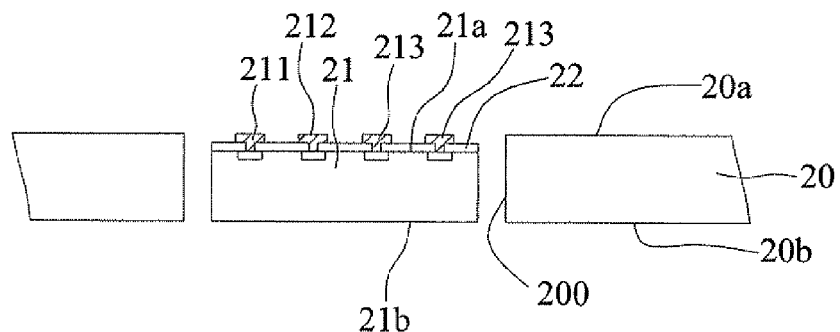
FIG. 2A through FIG. 2G are cross-sectional views of a circuit board having a semiconductor chip embedded therein described by reference to a fabrication process of the circuit board according to the present invention.
Figure 2A:
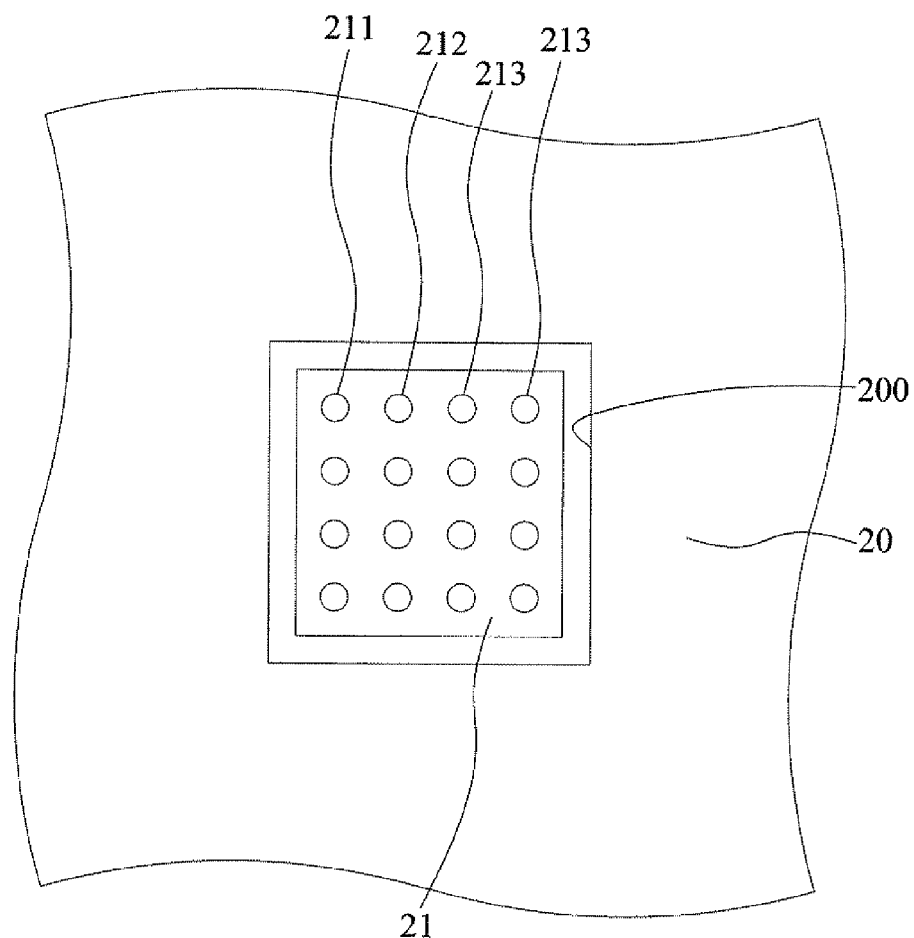

Referring to FIG. 2A and FIG. 2A', a core board 20 is provided, and the core board 20 is an insulated board. The core board 20 has a first surface 20a and an opposing second surface 20b, and has a through-hole 200 disposed in the core board 20 to penetrate the first surface 20a and the second surface 20b. A semiconductor chip 21 is received in the through-hole 200. The semiconductor chip 21 has a first active surface 21a and an opposing second active surface 21b. A passivation layer 22 is provided on the first active surface 21a. A plurality of first electrode pads are disposed on the passivation layer 22. The first electrode pads comprise signal pads 211, power pads 212, and ground pads 213. The first electrode pads are electrically connected to the semiconductor chip 21. An alignment target is disposed in a clean area of the semiconductor chip 21, or one of the first electrode pads is the alignment target (not shown). The second active surface 21b is an inactive surface.

Figure 2B:
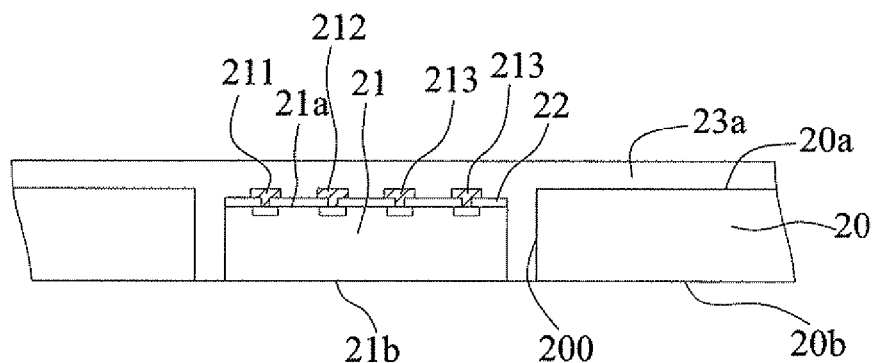

Referring to FIG. 2B, a first dielectric layer 23a is disposed on the first surface 20a of the core board 20 and the first active surface 21a of the semiconductor chip 21. The first dielectric layer 23a fills a gap between the through-hole 200 and the semiconductor chip 21 so as for the semiconductor chip 21 to be fixed in position to the through-hole 200.

Figure 2C:
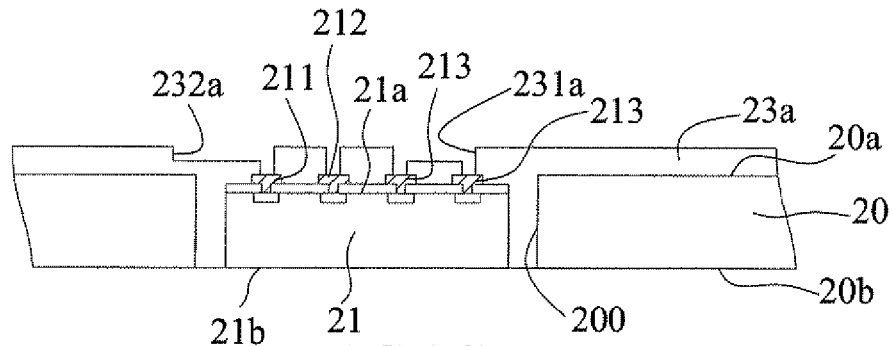

Referring to FIG. 2C, a plurality of first vias 231a and first trenches 232a are disposed in the first dielectric layer 23a. A portion of a surface of the signal pads 211, the power pads 212 and the ground pads 213 is exposed from the first vias 231a. A portion of the first trenches 232a is in communication with the first vias 231a. Forming the first vias 231a and the first trenches 232a entails forming a resist layer on the first dielectric layer 23a, etching the first dielectric layer 23a by lithography configured for patterning, and removing a portion of the first dielectric layer 23a by a laser beam. Alternatively, a photoresist layer configured for patterning is not applied to the surface of the first dielectric layer 23a; instead, forming the first vias 231a and the first trenches 232a entails etching the first dielectric layer 23a by plasma or reactive ion etching and removing a portion of the first dielectric layer 23a by a laser beam.

Figure 2D:
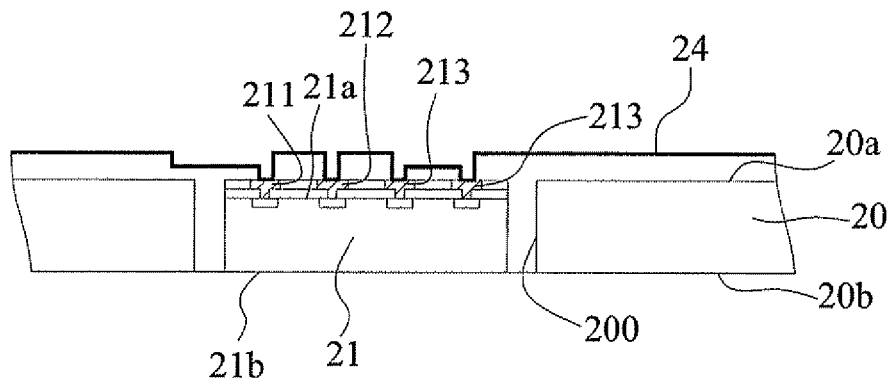

Referring to FIG. 2D, a conductive layer 24 is disposed on the first dielectric layer 23a, the inner wall of the first vias 231a, the inner wall of the first trenches 232a, and the first electrode pads by sputtering (physical deposition) or electroless plating (chemical deposition). The conductive layer 24 functions as a path of electrical conduction required for metal electroplating (described later). The conductive layer 24 is made of a metal or an alloy or comprises a plurality of metal layers deposited. Specifically speaking, the conductive layer 24 is made of copper, tin, nickel, chromium, titanium, or copper-chromium alloy. Alternatively, the conductive layer 24 is made of a conductive polymer, such as polyacetylenel, polyaniline, or organosulfide.

Figure 2E:
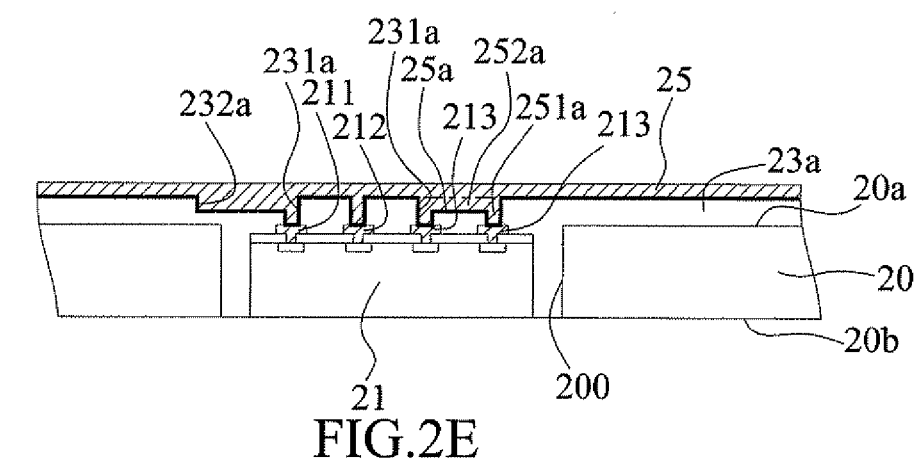

Referring to FIG. 2E, during its fabrication process, the circuit board comprises a metal layer 25 disposed on the conductive layer 24, a first circuit layer 25a disposed in the first trenches 232a, a plurality of first conductive vias 251a disposed in the first vias 231a for electrically connecting with the first electrode pads, wherein the first circuit layer 25a has a plurality of series-connection portions 252a.

Figure 2F:
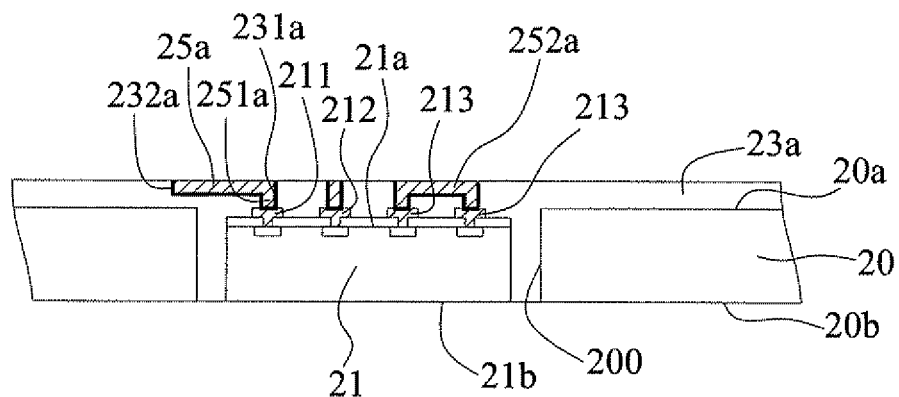
Figure 2F:
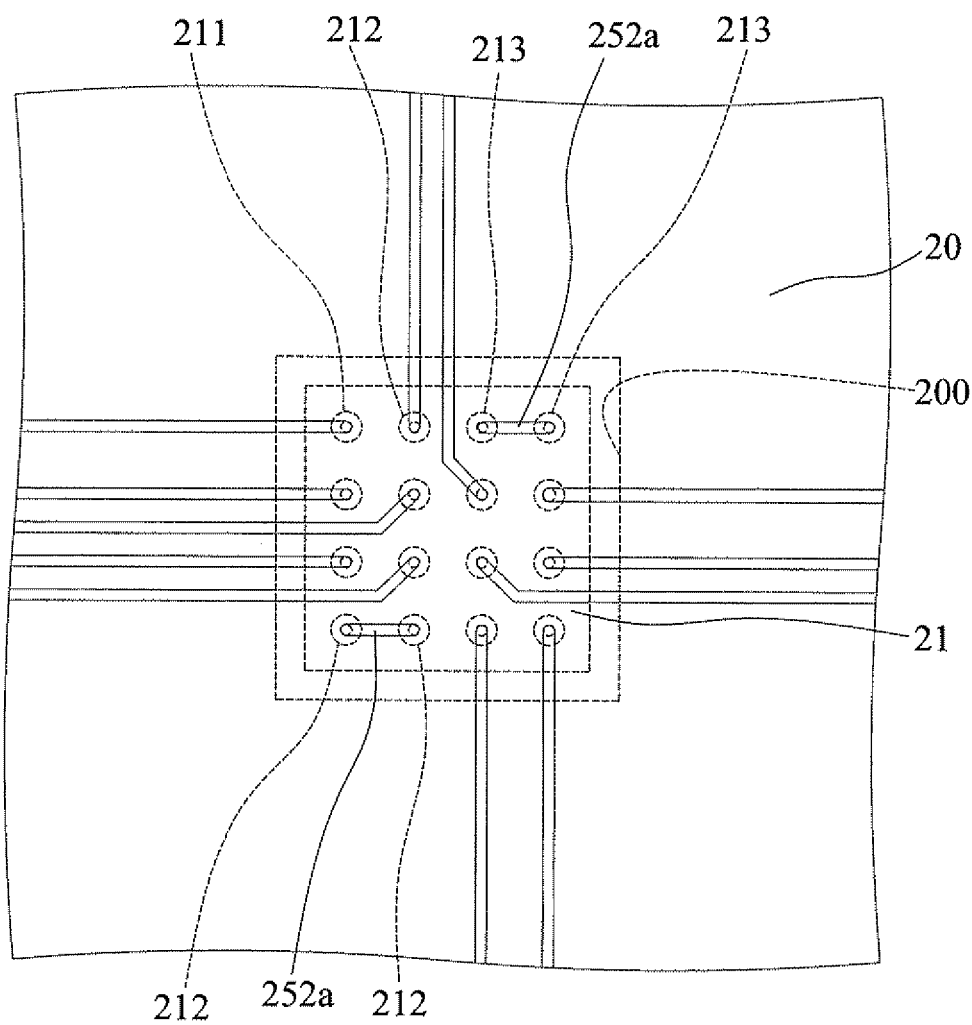

Referring to FIG. 2F and FIG. 2F', the metal layer 25 disposed on the first vias 231a and on the first trenches 232a and functioning not as the first circuit layer 25a and the conductive layer 24 otherwise covered by the metal layer 25 are removed, so as for the first circuit layer 25a to be flush with the first dielectric layer 23a, as shown in FIG. 2F. Also, the series-connection portions 252a of the first circuit layer 25a are electrically connected to at least two said power pads 212 or at least two said ground pads 213, so as to reduce noise and enhance electric performance, as shown in FIG. 2F'.

Figure 2G:
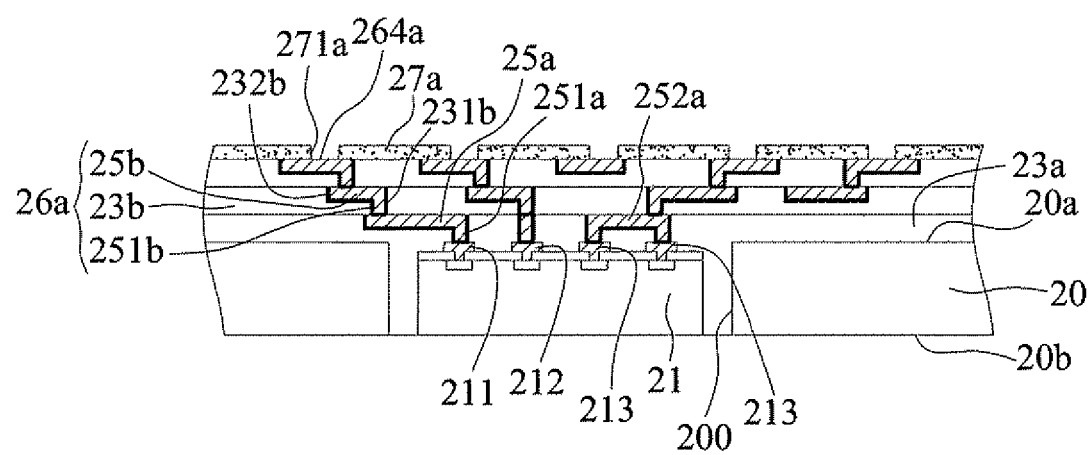

Referring to FIG. 2G, a first build-up structure 26a is provided on the first dielectric layer 23a and the first circuit layer 25a. The first build-up structure 26a comprises: a second dielectric layer 23b having second vias 231b and second trenches 232b, a second circuit layer 25b disposed in the second trenches 232b of the second dielectric layer 23b and flush with the second dielectric layer 23b, and a plurality of second conductive vias 251b disposed in the second vias 231b of the second dielectric layer 23b, allowing the second conductive vias 251b to be electrically connected to the first circuit layer 25a and the second circuit layer 25b, the first electrical contact pads 264a to be provided on the first build-up structure 26a, a first solder mask layer 27a to be provided on the first build-up structure 26a, and a portion of a surface of the first electrical contact pads 264a to be exposed from a plurality of first solder mask layer openings 271a in the first solder mask layer 27a.

The present invention further provides a circuit board having a semiconductor chip embedded therein. The circuit board comprises: a core board 20 having a first surface 20a, an opposing second surface 20b, and a through-hole 200 disposed in the core board 20 to penetrate the first and second surfaces 20a, 20b; a semiconductor chip 21 received in the through-hole 200 and having a first active surface 21a and an opposing second active surface 21b, wherein a plurality of first electrode pads comprising signal pads 211, power pads 212, and ground pads 213 are disposed on the first active surface 21a; a first dielectric layer 23a provided on the first surface 20a of the core board 20 and the first active surface 21a of the semiconductor chip 21 and configured to fill a gap between the through-hole 200 and the semiconductor chip 21 so as for the semiconductor chip 21 to be fixed in position to the through-hole 200; and the first circuit layer 25a disposed in the first dielectric layer 23a so as to be flush with the first dielectric layer 23a, provided with a plurality of first conductive vias 251a disposed in the first dielectric layer 23a, and electrically connected to the first electrode pads provided on the semiconductor chip 21, wherein the first circuit layer 25a has a plurality of series-connection portions 252a.

Regarding the circuit board having a semiconductor chip embedded therein, the core board 20 is an insulated board, and the second active surface 21b of the semiconductor chip 21 is an inactive surface. The first dielectric layer 23a has a plurality of first vias 231a and first trenches 232a. Portions of the first trenches 232a are in communication with the first vias 231a. The first circuit layer 25a is disposed in the first trenches 232a. The first conductive vias 251a are disposed in the first vias 231a. The series-connection portions 252a are electrically connected to at least two said power pads 212. Alternatively, the series-connection portions 252a are electrically connected to at least two said ground pads 213.

A passivation layer 22 is disposed on the first active surface 21a of the semiconductor chip 21. The first electrode pads are provided on the passivation layer 22 and electrically connected to the semiconductor chip 21. An alignment target is disposed in a clean area of the semiconductor chip 21, or one of the first electrode pads is the alignment target.

The circuit board further comprises a first build-up structure 26a provided on the first dielectric layer 23a and the first circuit layer 25a. The first build-up structure 26a comprises: a second dielectric layer 23b having second vias 231b and second trenches 232b; a second circuit layer 25b disposed in the second trenches 232b of the second dielectric layer 23b and flush with the second dielectric layer 23b, and a plurality of second conductive vias 251b disposed in the second vias 231b of the second dielectric layer 23b and electrically connected to the first circuit layer 25a and the second circuit layer 25b, allowing the first electrical contact pads 264a to be provided on the first build-up structure 26a, the first build-up structure 26a to be covered with a first solder mask layer 27a, and a portion of a surface of the first electrical contact pads 264a to be exposed from a plurality of first solder mask layer openings 271a in the first solder mask layer 27a.

Figure 3A:
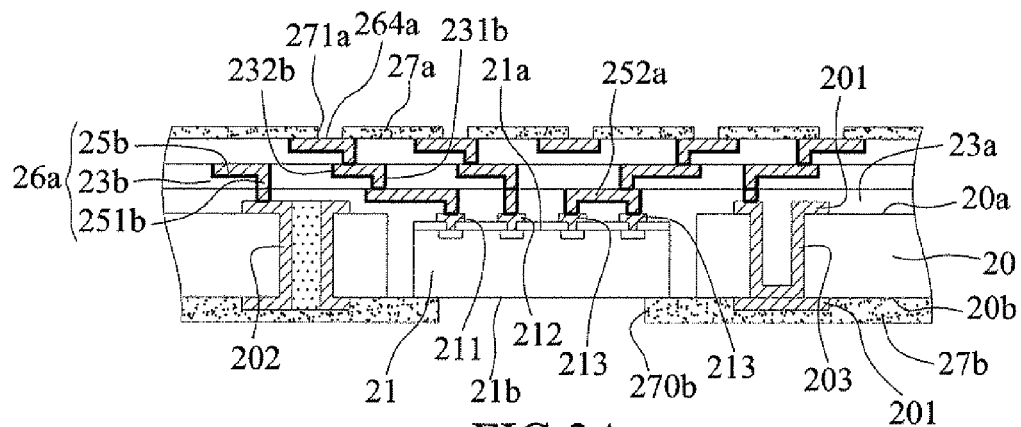
FIG. 3A through FIG. 3C are cross-sectional views of another embodiment of a circuit board having a semiconductor chip embedded therein according to the present invention.
Figure 3B:
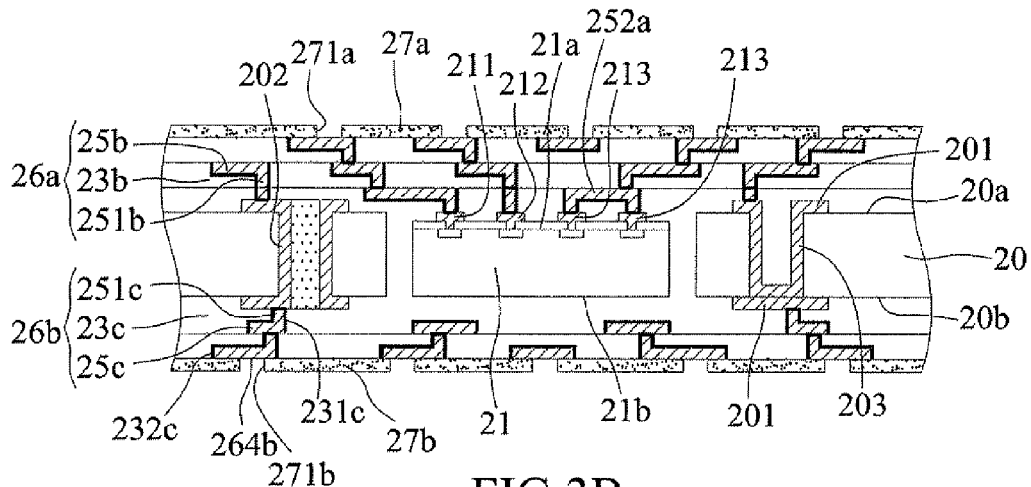
Figure 3C:
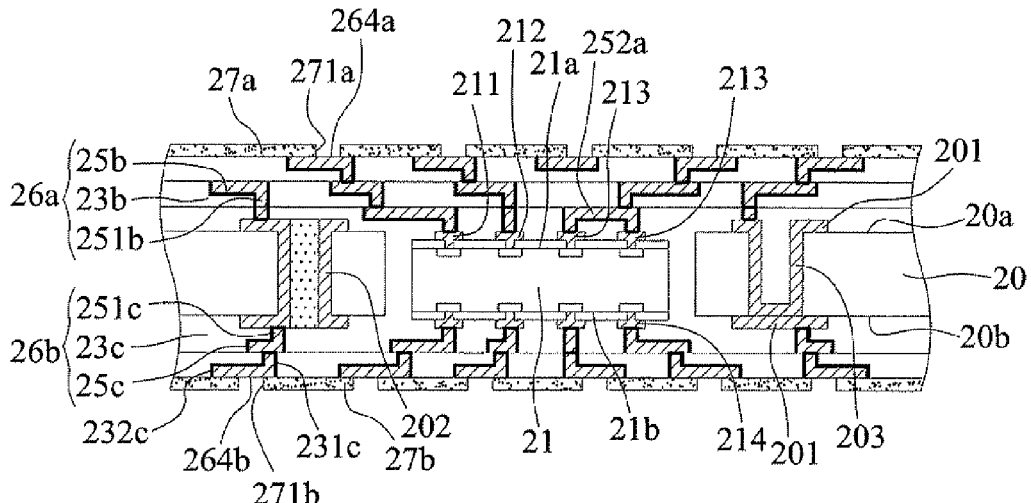

Referring to FIG. 3A through FIG. 3C, cross-sectional views of another embodiment of a circuit board having a semiconductor chip embedded therein according to the present invention are shown.

Referring to FIG. 3A, the core board 20 is configured to be a circuit board having circuits thereon, provided with a core circuit layer 201 on the first surface 20a and the second surface 20b of the core board 20, and provided with a plating through hole 202 or fourth conductive vias 203 penetrating the core board 20 for electrically connecting the core circuit layer 201 on the first and second surfaces 20a, 20b of the core board 20. The second active surface 21b of the semiconductor chip 21 is an inactive surface. A second solder mask layer 27b is provided on the second surface 20b of the core board 20. A plurality of second solder mask layer openings 271b are provided in the second solder mask layer 27b to expose the inactive surface of the semiconductor chip 21.

Referring to FIG. 3B, which is a cross-sectional view of the structure shown in FIG. 2G, the core board 20 is configured to be a circuit board having circuits thereon, and a second build-up structure 26b is provided on the second surface 20b of the core board 20. The second build-up structure 26b comprises: a third dielectric layer 23c having third vias 231c and third trenches 232c, a third circuit layer 25c disposed in the third trenches 232c of the third dielectric layer 23c and flush with the third dielectric layer 23c, and a plurality of third conductive vias 251c disposed in the third vias 231c of the dielectric layer 23c and electrically connected to the third circuit layer 25c, wherein a plurality of second electrical contact pads 264b are disposed on the third circuit layer 25c on top of the second build-up structure 26b, and the second build-up structure 26b is covered with a second solder mask layer 27b having a plurality of second solder mask layer openings 271b provided therein for exposing a portion of a surface of the second electrical contact pads 264b. The first build-up structure 26a and the second build-up structure 26b which together sandwich the core board 20 are electrically connected to each other by means of the plating through hole 202 or the fourth conductive vias 203 which penetrates the core board 20.

The first dielectric layer 23a and third dielectric layer 23c fill a gap between the through-hole 200 of the core board 20 and the semiconductor chip 21 so as for the semiconductor chip 21 to be fixed in position to the through-hole 200.

Referring to FIG. 3C, which is a cross-sectional view of the structure shown in FIG. 2G, the core board 20 is a circuit board with circuits thereon. A plurality of second electrode pads 214 are provided on the second active surface 21b of the semiconductor chip 21. A second build-up structure 26b is provided on the second surface 20b of the core board 20 and the second active surface 21b of the semiconductor chip 21. The second build-up structure 26b comprises: a third dielectric layer 23c having third vias 231c and the third trenches 232c; a third circuit layer 25c disposed in the third trenches 232c of the third dielectric layer 23c and flush with the third dielectric layer 23c; and a plurality of third conductive vias 251c disposed in the third vias 231c of the third dielectric layer 23c and electrically connected to the third circuit layer 25c and second electrode pads 214, allowing a plurality of second electrical contact pads 264b to be provided on the second build-up structure 26b, the second build-up structure 26b to be covered with a second solder mask layer 27b, and a portion of a surface of the second electrical contact pads 264b to be exposed from a plurality of second solder mask layer openings 271b provided in the second solder mask layer 27b. The first build-up structure 26a and the second build-up structure 26b which together sandwich the core board 20 are electrically connected to each other by means of the plating through hole 202 or the fourth conductive vias 203 which penetrates the core board 20.

The first dielectric layer 23a and the third dielectric layer 23c fill a gap between the through-hole 200 of the core board 20 and the semiconductor chip 21 so as for the semiconductor chip 21 to be fixed in position to the through-hole 200.

The present invention provides a circuit board having a semiconductor chip embedded therein with a view to overcoming drawbacks of the prior art, namely: a circuit is made from a metal layer that affects a alignment target, and thus conductive vias in the circuit layer are unlikely to be electrically connected to the electrode pads on the semiconductor chip accurately; the conventional circuit layer does not feature fine pitches and therefore is unfavorable for a high-density layout; and during high-frequency operation of the semiconductor chip, closely-provided signal pads bring about interference-induced noise, thus resulting in signal distortion and deterioration of electric performance.

The foregoing specific embodiments are only illustrative of the features and functions of the present invention but are not intended to restrict the scope of the present invention. It is apparent to those skilled in the art that all equivalent modifications and variations made in the foregoing embodiments according to the spirit and principle in the disclosure of the present invention should fall within the scope of the appended claims.

What is claimed is:

1. A circuit board having a semiconductor chip embedded therein, comprising:
   a core board having opposing first and second surfaces and a through-hole penetrating the first and second surfaces;
   the semiconductor chip received in the through-hole and having a first active surface and an opposing second active surface, wherein a plurality of first electrode pads comprising signal pads, power pads, and ground pads are provided on the first active surface;
   a first dielectric layer disposed on the first surface of the core board and the first active surface of the semiconductor chip and fills a gap between the through-hole and the semiconductor chip so as for the semiconductor chip to be fixed in position the through-hole;
   a first circuit layer disposed in the first dielectric layer so as to be flush with the first dielectric layer, provided with a plurality of first conductive vias disposed in the first dielectric layer, and electrically connected to the first electrode pads provided on the semiconductor chip, wherein the first circuit layer has a plurality of series-connection portions; and
   a build-up structure provided on the second surface of the core board, the build-up structure comprising:
   a dielectric layer having a plurality of vias and a plurality of trenches;
   a circuit layer disposed in the trenches of the dielectric layer and being flush with the dielectric layer; and
   a plurality of conductive vias disposed in the vias of the dielectric layer and electrically connected to the circuit layer; and further comprising another build-up structure disposed on the first dielectric layer and the first circuit layer, the another build-up structure comprising:
   a second dielectric layer having another plurality of vias and another plurality of trenches;
   a second circuit layer disposed in the another trenches of the second dielectric layer and being flush with the second dielectric layer; and a plurality of second conductive vias disposed in the another vias of the second dielectric layer, allowing the second conductive vias to be electrically connected to the first and second circuit layers, the second circuit layer on the top of the another build-up structure to be provided with electrical contact pads, the another build-up structure to be covered with a solder mask layer, and a portion of a surface of the electrical contact pads to be exposed from a plurality of solder mask layer openings in the solder mask layer.

2. The circuit board of claim 1, wherein the core board is an insulated board.

3. The circuit board of claim 1, wherein a passivation layer is disposed on the first active surface of the semiconductor chip, allowing the first electrode pads to be provided on the passivation layer and electrically connected to the semiconductor chip.

4. The circuit board of claim 1, further comprising an alignment target disposed in a clean area of the semiconductor chip or being one of the first electrode pads.

5. The circuit board of claim 1, wherein the first dielectric layer has a plurality of first vias and first trenches, and portions of the first trenches are in communication with the first vias, allowing the first circuit layer to be disposed in the first trenches and the first conductive vias in the first vias.

6. The circuit board of claim 1, wherein the series-connection portions are electrically connected to at least two said power pads.

7. The circuit board of claim 1, wherein the series-connection portions are electrically connected to at least two said ground pads.

8. The circuit board of claim 1, wherein the core board is a circuit board having circuits thereon, provided with a core circuit layer on the first surface and the second surface of the core board, and provided with a plating through hole or another conductive vias penetrating the core board for electrically connecting the core circuit layer on the first and second surfaces of the core board.

9. The circuit board of claim 1, wherein a plurality of second electrode pads are provided on the second active surface of the semiconductor chip.

10. The circuit board of claim 8, wherein a plurality of electrical contact pads are provided on the circuit layer on the top of the build-up structure, and the build-up structure is covered with a solder mask layer having a plurality of solder mask layer openings provided therein for exposing a portion of a surface of the electrical contact pads.

11. The circuit board of claim 9, wherein the conductive vias are further electrically connected to the second electrode pads, the circuit layer on the top of the build-up structure is provided with a plurality of electrical contact pads, the build-up structure is covered with a solder mask layer, and a portion of a surface of the electrical contact pads is exposed from a plurality of solder mask layer openings in the solder mask layer.

12. The circuit board of claim 10, wherein the first dielectric layer and the dielectric layer fill a gap between the through-hole of the core board and the semiconductor chip so as for the semiconductor chip to be fixed in position to the through-hole.

13. The circuit board of claim 11, wherein the first dielectric layer and the dielectric layer fill a gap between the through-hole of the core board and the semiconductor chip so as for the semiconductor chip to be fixed in position to the through-hole.

* * * * *